(12) United States Patent
Hara

(10) Patent No.: US 8,375,273 B2
(45) Date of Patent: Feb. 12, 2013

(54) SEMICONDUCTOR DEVICE INCLUDING A NAND FLASH MEMORY

(75) Inventor: Tokumasa Hara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 300 days.

(21) Appl. No.: 12/883,728

(22) Filed: Sep. 16, 2010

(65) Prior Publication Data

US 2011/0231724 A1     Sep. 22, 2011

(30) Foreign Application Priority Data

Mar. 17, 2010   (JP) .................................. 2010-061531

(51) Int. Cl.
*G11C 29/00*     (2006.01)

(52) U.S. Cl. ................ 714/763; 365/185.09; 365/185.33

(58) Field of Classification Search ................... 714/763; 365/185.09, 185.33
See application file for complete search history.

(56) References Cited

U.S. PATENT DOCUMENTS

| | | | |
|---|---|---|---|
| 7,012,845 B2 * | 3/2006 | Kozakai et al. ............... | 365/200 |
| 7,096,406 B2 | 8/2006 | Kanazawa et al. | |
| 7,372,744 B2 | 5/2008 | Shiga et al. | |
| 7,519,754 B2 * | 4/2009 | Wang et al. .................... | 710/110 |
| 7,830,711 B2 * | 11/2010 | Kawamoto et al. ....... | 365/185.09 |
| 7,864,580 B2 * | 1/2011 | Tokiwa ..................... | 365/185.09 |
| 7,933,158 B2 * | 4/2011 | Kozakai et al. .......... | 365/189.09 |
| 7,940,575 B2 * | 5/2011 | Ravasio et al. ........... | 365/189.02 |
| 7,941,593 B2 * | 5/2011 | Lee ............................... | 711/103 |
| 2006/0224789 A1 | 10/2006 | Cho et al. | |

FOREIGN PATENT DOCUMENTS

| | | |
|---|---|---|
| JP | 2000-348497 | 12/2000 |
| JP | 2003-67260 | 3/2003 |
| JP | 2006-286179 | 10/2006 |

* cited by examiner

*Primary Examiner* — Esaw Abraham
(74) *Attorney, Agent, or Firm* — Oblon, Spivak, McClelland, Maier & Neustadt, L.L.P.

(57) ABSTRACT

According to one embodiment, a semiconductor device includes a NAND flash memory, an input/output unit, a switch, and a controller. The input/output unit includes an ECC unit configured to perform an ECC process on data input to the NAND flash memory, and/or data output from the NAND flash memory, and an interface configured to exchange data with an external apparatus, and controls input/output of data between the NAND flash memory and the external apparatus. The switch is connected to the NAND flash memory and the input/output unit. The controller controls the NAND flash memory and the input/output unit, and switches a connection between the NAND flash memory and the ECC unit, and a connection between the NAND flash memory and the interface via the switch.

17 Claims, 8 Drawing Sheets

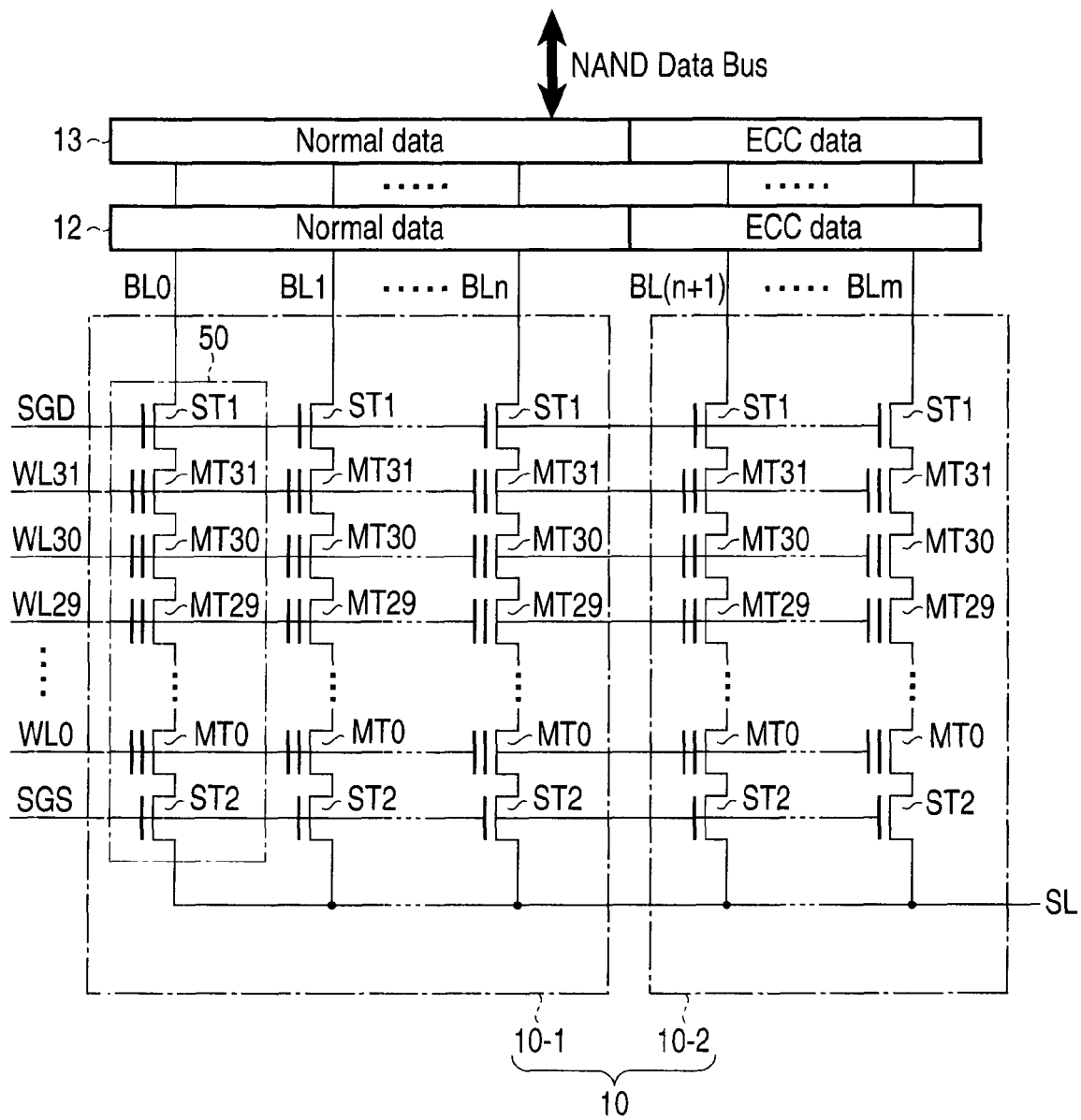
F I G. 2

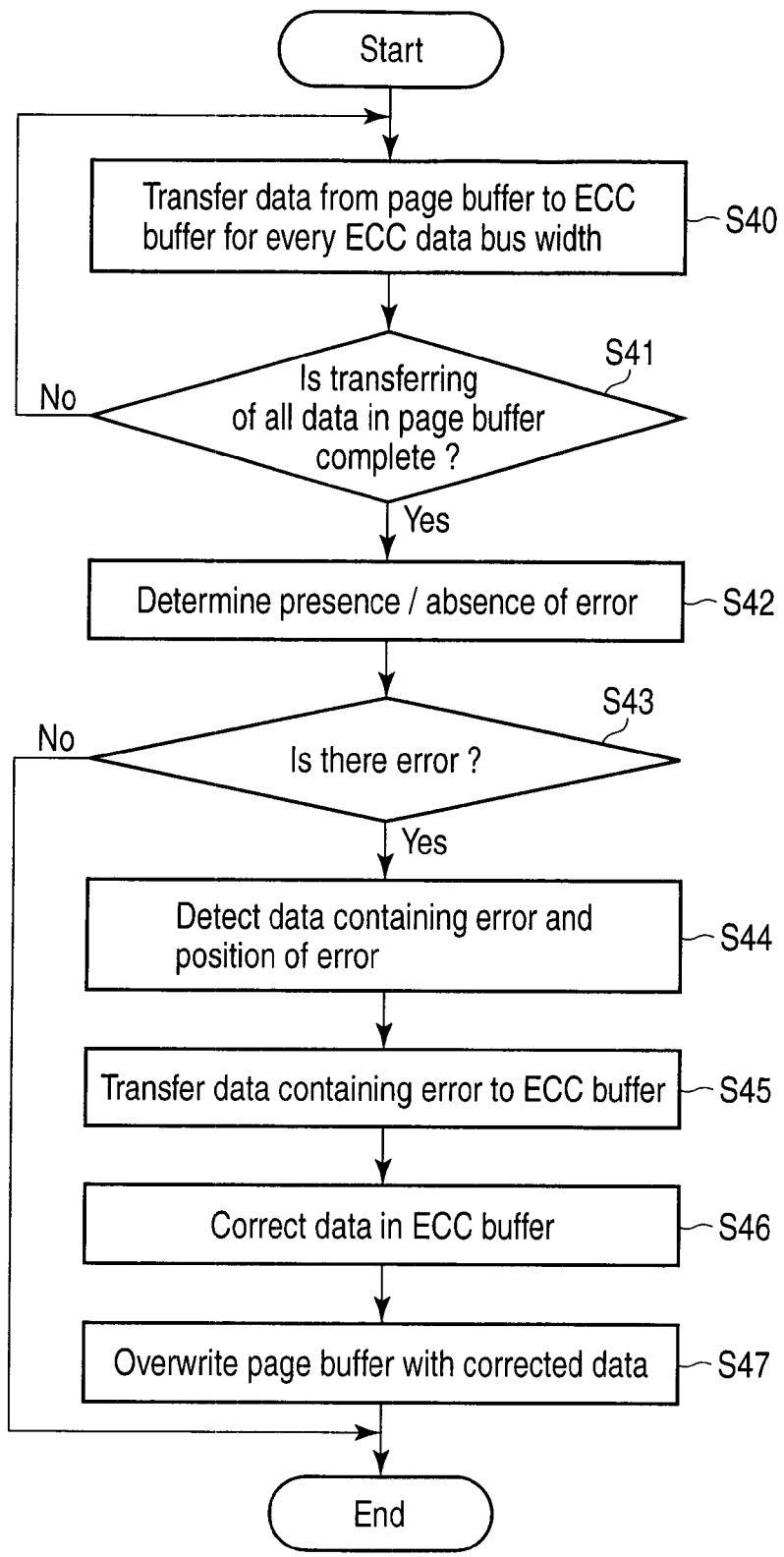
F I G. 4

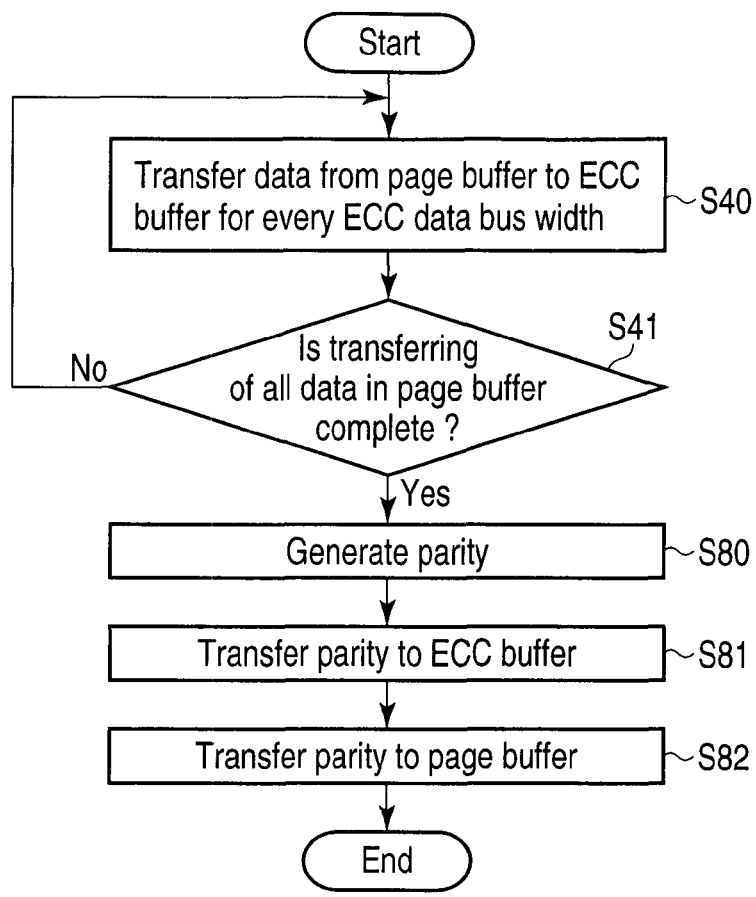
F I G. 8
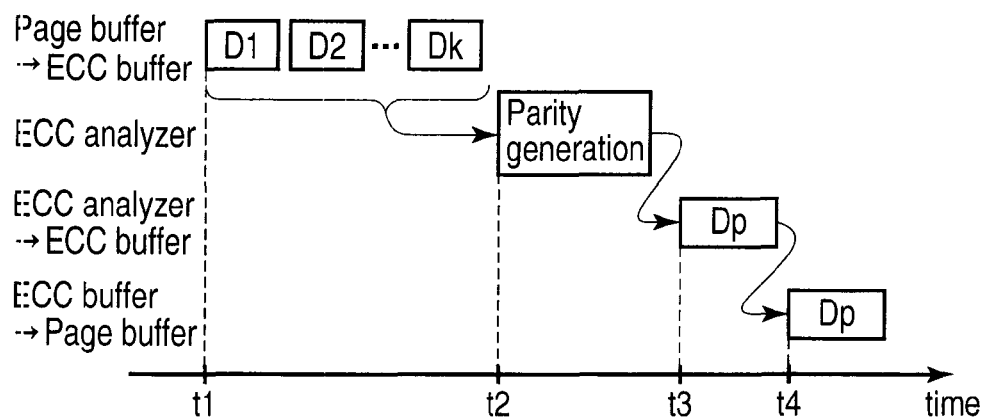
F I G. 9

SEMICONDUCTOR DEVICE INCLUDING A NAND FLASH MEMORY

CROSS-REFERENCE TO RELATED APPLICATIONS

This application is based upon and claims the benefit of priority from Japanese Patent Application No. 2010-061531, filed Mar. 17, 2010; the entire contents of which are incorporated herein by reference.

FIELD

Embodiments described herein relate generally to a semiconductor device, e.g., a semiconductor device including a NAND flash memory.

BACKGROUND

Conventionally, the ECC (Error Checking and Correcting) function has extensively been used in NAND flash memories. The ECC function is disclosed in, e.g., Jpn. Pat. Appln. KOKAI Publication Nos. 2003-067260 and 2000-348497.

Also, a memory system in which a plurality of types of memories are integrated into one chip is known. An example is disclosed in Jpn. Pat. Appln. KOKAI Publication No. 2006-286179. The system disclosed in this reference includes a NAND flash memory as a main memory, and an SRAM as a data buffer. In addition, the NAND flash memory has the ECC function. Error correction is performed when transferring data from the NAND flash memory in order to read out the data. Also, parity is generated when transferring data from the SRAM to the NAND flash memory in order to write the data.

This arrangement requires at least one data buffer (SRAM cell array), and sometimes includes two data buffers in order to increase the data throughput. However, the circuit area increases because the SRAM must be needed.

BRIEF DESCRIPTION OF THE DRAWINGS

FIG. 2 is a circuit diagram of a memory cell array according to the embodiment;

FIG. 4 is a flowchart of a data correction method according to the embodiment;

FIG. 8 is a flowchart of a parity generation method according to the embodiment;

FIG. 9 is a timing chart of the parity generation method according to the embodiment;

DETAILED DESCRIPTION

In general, according to one embodiment, a semiconductor device includes: a NAND flash memory; an input/output unit; a switch; and a controller. The input/output unit includes an ECC unit configured to perform an ECC process on data input to the NAND flash memory, and/or data output from the NAND flash memory, and an interface configured to exchange data with an external apparatus. The input/output unit controls input/output of data between the NAND flash memory and the external apparatus. The switch is connected to the NAND flash memory and the input/output unit. The controller controls the NAND flash memory and the input/output unit, and switches a connection between the NAND flash memory and the ECC unit, and a connection between the NAND flash memory and the interface via the switch.

Figure 1:
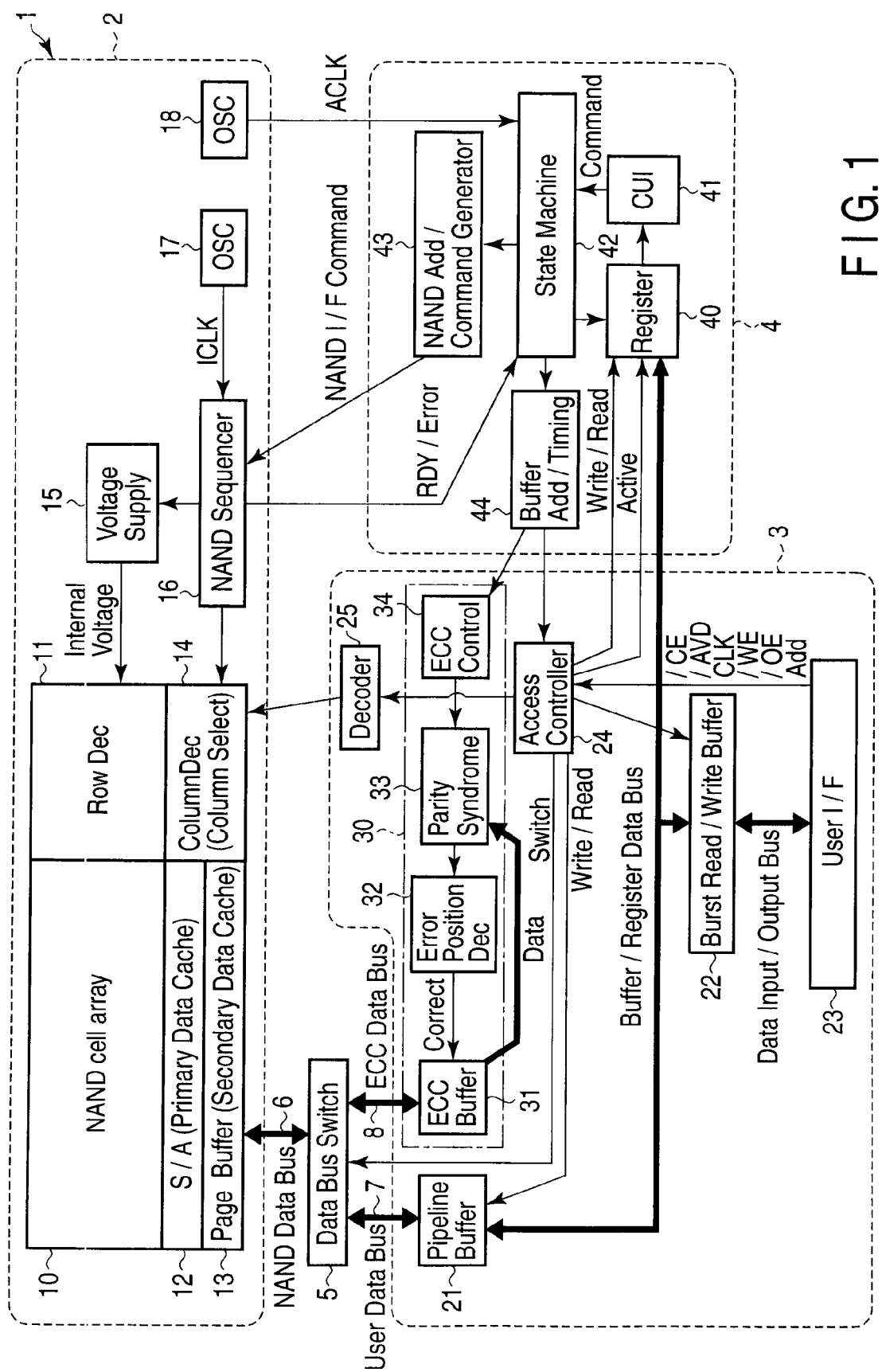
FIG. 1 is a block diagram of a memory system according to an embodiment.

A semiconductor device according to the embodiment will be explained below with reference to FIG. 1. FIG. 1 is a block diagram of a memory system according to this embodiment.

<Overall Configuration of Memory System>

As shown in FIG. 1, a memory system 1 according to this embodiment roughly includes a NAND flash memory 2, input/output unit 3, controller 4, and data bus switch 5. The NAND flash memory 2, input/output unit 3, controller 4, and data bus switch 5 are formed on a same semiconductor substrate, and integrated into one chip. Details of each block will be explained below.

<NAND Flash Memory 2>

The NAND flash memory 2 functions as the main memory of the memory system 1. As shown in FIG. 1, the NAND flash memory 2 includes a memory cell array 10, a row decoder 11, a sense amplifier 12, a page buffer 13, a column decoder 14, a voltage supply 15, a sequencer 16, and oscillators 17 and 18.

The memory cell array 10 includes a plurality of memory cell transistors capable of holding data. FIG. 2 is a circuit diagram of the memory cell array 10, and shows the sense amplifier 12 and page buffer 13 in addition to the memory cell array 10. As shown in FIG. 2, the memory cell array 10 generally includes a first area 10-1 and second area 10-2. The first area 10-1 holds data (to be referred to as main data hereinafter) such as user data. The second area 10-2 is used as a spare area of the first area 10-1, and holds information for error correction (e.g., parity) and the like.

The first and second areas 10-1 and 10-2 each include a plurality of memory cell units 50. Each memory cell unit 50 includes, e.g., 32 memory cell transistors MT (MT0 to MT31), and selection transistors ST1 and ST2. The memory cell transistor MT has a stacked gate structure including a charge accumulation layer (e.g., a floating gate) formed on a semiconductor substrate with a gate insulting film interposed therebetween, and a control gate formed on the charge accumulation layer with an inter-gate insulating film interposed therebetween. Note that the number of memory cell transistors MT is not limited to 32, and may be, e.g., 8, 16, 64, 128, or 256. That is, the number of memory cell transistors MT is not limited to these values. The memory cell transistor MT can also have a MONOS (Metal Oxide Nitride Oxide Silicon) structure in which electrons are trapped in a nitride film.

Adjacent memory cell transistors MT share the source or drain. The memory cell transistors MT are arranged between the selection transistors ST1 and ST2 so as to connect the current paths in series. The drain at one end of the series-connected memory cell transistors MT is connected to the source of the selection transistor ST1, and the source at the other end is connected to the drain of the selection transistor ST2.

The control gates of the memory cell transistors MT in the same row are connected together to one of word lines WL (WL0 to WL31). The gates of the selection transistors ST1 in the same row are connected together to a selection gate line SGD, and the gates of the selection transistors ST2 in the same row are connected together to a selection gate line SGS. The first and second areas 10-1 and 10-2 share the word lines WL and selection gate lines SGD and SGS.

In the first area 10-1, the drains of the selection transistors ST1 in the same column are connected together to bit lines BL (BL0 to BLn (n is a natural number)). In the second area 10-2, the drains of the selection transistors ST1 in the same column are connected together to bit lines BL (BL(n+1) to BLm (m is a natural number)). The sources of the selection transistors ST2 are connected together to a source line SL.

In the above arrangement, data are simultaneously written in or read out from a plurality of memory cell transistors MT connected to the same word line WL, and this unit is called a page. In addition, data are simultaneously erased from a plurality of memory cell units 50 in the same row, and this unit is called a memory block.

The sense amplifier 12 and page buffer 13 are buffer memories capable of holding page-size data, and respectively function as a primary data cache and secondary data cache of the NAND flash memory 2.

In a data read operation, the sense amplifier 12 senses, amplifies, and temporarily holds data read out from the memory cell array 10, and transfers the data to the page buffer 13. In a data write operation, the sense amplifier 12 transfers data transferred from the page buffer 13 to the bit line BL, thereby programming the data.

The page buffer 13 is connected to the input/output unit 3 via a NAND data bus 6 and a user data bus 7 or ECC data bus 8. In a data read operation, the page buffer 13 outputs data transferred from the sense amplifier 12 to the input/output unit 3. In a data write operation, the page buffer 13 temporarily holds data input from the input/output unit 3, and transfers the data to the sense amplifier 12.

The sense amplifier 12 and page buffer 13 each include a latch circuit arranged for, e.g., each bit line BL, to hold one-page data. As shown in FIG. 2, therefore, a part of the area is used to hold main data, and the rest is used to hold ECC data such as parity. Note that the latch circuits hold at least one-page data. Accordingly, when data programming and read are performed for every even-numbered or odd-numbered bit line, the page size is half that when data programming and read are performed for all bit lines at once. This halves the number of necessary latch circuits. The page-size is, e.g., 4 KB.

Referring to FIG. 1 again, the row decoder 11 selects one page (i.e., one word line WL) of the memory cell array 10. The column decoder 14 selects one column (i.e., one bit line BL) of the memory cell array 10.

The voltage supply 15 raises or lowers an externally applied voltage, thereby generating a voltage necessary for data programming, read, or erase. The voltage supply 15 supplies the generated voltage to, e.g., the row decoder 11. The voltage generated by the voltage supply 15 is applied to the word line WL.

The sequencer 16 controls the operation of the entire NAND flash memory 2. That is, when receiving a command (NAND I/F Command) from the controller 4, the sequencer 16 executes a sequence for data programming, read, or erase in response to the command. In accordance with this sequence, the sequencer 16 controls the operations of, e.g., the voltage supply 15, sense amplifier 12, and page buffer 13.

The oscillator 17 generates an internal clock ICLK. That is, the oscillator 17 functions as a clock generator. The oscillator 17 supplies the generated internal clock ICLK to the sequencer 16. The sequencer 16 operates in synchronism with the internal clock ICLK.

The oscillator 18 generates an internal clock ACLK. That is, the oscillator 18 functions as a clock generator. The oscillator 18 supplies the generated internal clock ACLK to the controller 4 and input/output unit 3. The internal clock ACLK is a reference clock of the operations of the controller 4 and input/output unit 3.

<Data Bus Switch 5>

The data bus switch 5 connects the NAND data bus 6 to the user data bus 7 or ECC data bus 8 in accordance with an instruction from the input/output unit 3 and the controller 4 (to be described later). For example, the data bus switch 5 connects the NAND data bus 6 to the user data bus 7 in a normal state, and connects the NAND data bus 6 to the ECC data bus 8 as needed. The NAND data bus 6, user data bus 7, and ECC data bus 8 have, e.g., the same bus width, and the bus width is, e.g., 4 bytes.

<Input/Output Unit 3>

The input/output unit 3 will be explained below with reference to FIG. 1. The input/output unit 3 includes a pipeline buffer 21, burst buffer 22, user interface 23, access controller 24, decoder 25, and ECC unit 30.

Note that in the memory system 1 according to this embodiment, the NAND flash memory 2 functions as a main memory, and the input/output unit 3 controls an input/output of data with respect to the NAND flash memory 2. Therefore, when reading out data from the NAND flash memory 2 to the outside, the data read out from the memory cell array 10 of the NAND flash memory 2 is first stored in the page buffer 13. After that, the data in the page buffer 13 is output outside via the user interface 23 in accordance with a user's request. On the other hand, when storing data in the NAND flash memory 2, the data supplied from the outside is first stored in the page buffer 13 via the user interface 23. After that, the data in the page buffer 13 is written in the memory cell array 10.

In the following description, the operation of reading out data from the memory cell array 10 to the page buffer 13 will be called data "load". Also, the operation of transferring data from the page buffer 13 to the user interface 23 will be called data "read".

In addition, the operation of transferring data to be stored in the NAND flash memory 2 from the user interface 23 to the page buffer 13 will be called data "write". Furthermore, the operation of writing data in the memory cell array 10 from the page buffer 13 will be called data "programming".

The input/output unit 3 will be explained again.

The ECC unit 30 executes error detection, error correction, and parity generation (these operations will collectively be called an ECC process in some cases hereinafter) for input/output data for the NAND flash memory 2. The ECC unit 30 includes an ECC buffer 31, ECC decoder (labeled as "Error Position Dec" in FIG. 1) 32, ECC analyzer (labeled as "Parity Syndrome" in FIG. 1) 33, and ECC controller 34.

The ECC buffer 31 is connected to the ECC data bus 8. The ECC buffer 31 is connected to the page buffer 13 of the NAND flash memory 2 via the ECC data bus 8 and NAND data bus 6. The ECC buffer 31 reads out data from the page buffer 13 via the NAND data bus 6 and ECC data bus 8, and transfers the data to the ECC analyzer 33. Also, the ECC buffer 31 temporarily holds data error-corrected by the ECC decoder 32 and parity generated by the ECC analyzer 33, and writes the data and parity in the page buffer 13 via the ECC data bus 8 and NAND data bus 6. The size of the ECC buffer 31 is, e.g., the same as the bus width of the ECC data bus 8, and is, e.g., 4 bytes. However, the size of the ECC buffer 31 can also be larger than the bus width of the ECC data bus 8.

In a data load operation, the ECC analyzer 33 performs the ECC process by using data transferred from the ECC buffer 31, thereby determining the presence/absence of an error in the data. In a data programming operation, the ECC analyzer 33 generates parity based on data transferred from the ECC buffer 31.

If the ECC analyzer 33 determines in a data load operation that an error is present, the ECC decoder 32 specifies the position of the error, reads out the corresponding data from the page buffer 13 to the ECC buffer 31, and corrects the data. In a data programming operation, the ECC decoder 32 causes the ECC buffer 31 to hold parity generated by the ECC analyzer 33, and transfer the parity to the page buffer 13.

The ECC controller 34 controls the ECC analyzer 33.

The user interface 23 will now be explained. The user interface 23 is connectable to a host apparatus (user) outside the memory system 1, and communicates with the host apparatus to controls the input/output of various signals such as data, control signals, address Add. Examples of the control signals are a chip enable signal /CE for enabling the entire memory system 1, an address valid signal /AVD for latching an address, a clock CLK for burst read, a write enable signal /WE for enabling a write operation, and an output enable signal /OE for enabling the output of data to the outside.

The user interface 23 is connected to the burst buffer 22 by a data input/output bus. The bus width of the data input/output bus is, e.g., 2 bytes. The user interface 23 transfers, to the access controller 24, control signals corresponding to, e.g., a data read request, data load request, and data programming request from the host apparatus. In a data read operation, the user interface 23 outputs data from the burst buffer 22 to the host apparatus. In a data write operation, the user interface 23 transfers data supplied from the host apparatus to the burst buffer 22.

The burst buffer 22 can transmit/receive data to/from the pipeline buffer 21 and controller 4 via a buffer/register data bus. The bus width of the buffer/register data bus is, e.g., the same as that of the user data bus 7. The burst buffer 22 temporarily holds data supplied from the host apparatus via the user interface 23, or data supplied from the pipeline buffer 21.

The pipeline buffer 21 is connected to the user data bus 7 and buffer/register data bus. In a data write operation, the pipeline buffer 21 temporarily holds data transferred from the burst buffer 22. The pipeline buffer 21 writes the data in the page buffer 13 via the user data bus 7 and NAND data bus 6. In a data read operation, the pipeline buffer 21 reads out data from the page buffer 13 via the user data bus 7 and NAND data bus 6, and transfers the data to the burst buffer 22 via the buffer/register data bus.

Next, the access controller 24 will be explained. The access controller 24 receives a control signal and address from the user interface 23. The access controller 24 controls the pipeline buffer 21, data bus switch 5, burst buffer 22, decoder 25, and controller 4 to execute an operation meeting a request from the host apparatus.

For example, in accordance with a request from the host apparatus, the access controller 24 activates a register 40 (to be described later) in the controller 4, and sets a command (Write/Read) in the register 40. Also, the access controller 24 instructs the pipeline buffer 21 to read out data from the page buffer 13 or burst buffer 22. Furthermore, the access controller 24 transfers an externally input address to the decoder 25.

The decoder 25 decodes the address (column address) supplied from the access controller 24. In accordance with the decoding result, that is, address, the decoder 25 controls the column decoder 14 of the NAND flash memory 2 to output data corresponding to a decoding result (address) in the page buffer 13.

<Controller 4>

The controller 4 will be explained below with reference to FIG. 1. The controller 4 controls the operations of the NAND flash memory 2 and input/output unit 3. That is, the controller 4 has the function of generally controlling the overall operation of the memory system 1. As shown in FIG. 1, the controller 4 includes the register 40, a command user interface 41, a state machine 42, a NAND address/command generator 43, and a buffer address/timing generator 44.

The register 40 is a register in which the operation state of a function is set. That is, the operation state of a function is set in the register 40 in accordance with a command supplied from the access controller 24. More specifically, a load command is set in the register 40 when loading data, and a program command is set in the register 40 when programming data.

When a predetermined command is set in the register 40, the command user interface 41 detects that a function execution command is given to the memory system 1. The command user interface 41 then issues an internal command signal (Command), and outputs the signal to the state machine 42.

Based on the internal command signal supplied from the command user interface 41, the state machine 42 controls the internal sequence operation of the memory system 1. The state machine 42 supports many functions such as load, programming, and erase, and controls the operations of the NAND flash memory 2 and input/output unit 3 so as to execute these functions. The state machine 42 performs these control operations in synchronism with the internal clock ACLK generated by the oscillator 18. Also, the state machine 42 can detect the operation state of the NAND flash memory 2 by a ready signal and error signal supplied from the sequencer 16.

The NAND address/command generator 43 controls the operation of the NAND flash memory 2 under the control of the state machine 42. More specifically, the NAND address/command generator 43 generates, e.g., an address and a command (Program/sense) supported by the NAND interface, and outputs the address and command to the NAND flash memory 2.

The buffer address/timing generator 44 controls the operation of the input/output unit 3 under the control of the state machine 42. More specifically, the buffer address/timing generator 44 issues a necessary address and command for the input/output unit 3, and outputs the address and command to the access controller 24 and ECC controller 34.

<Data Read Operation of Memory System 1>

Figure 3:
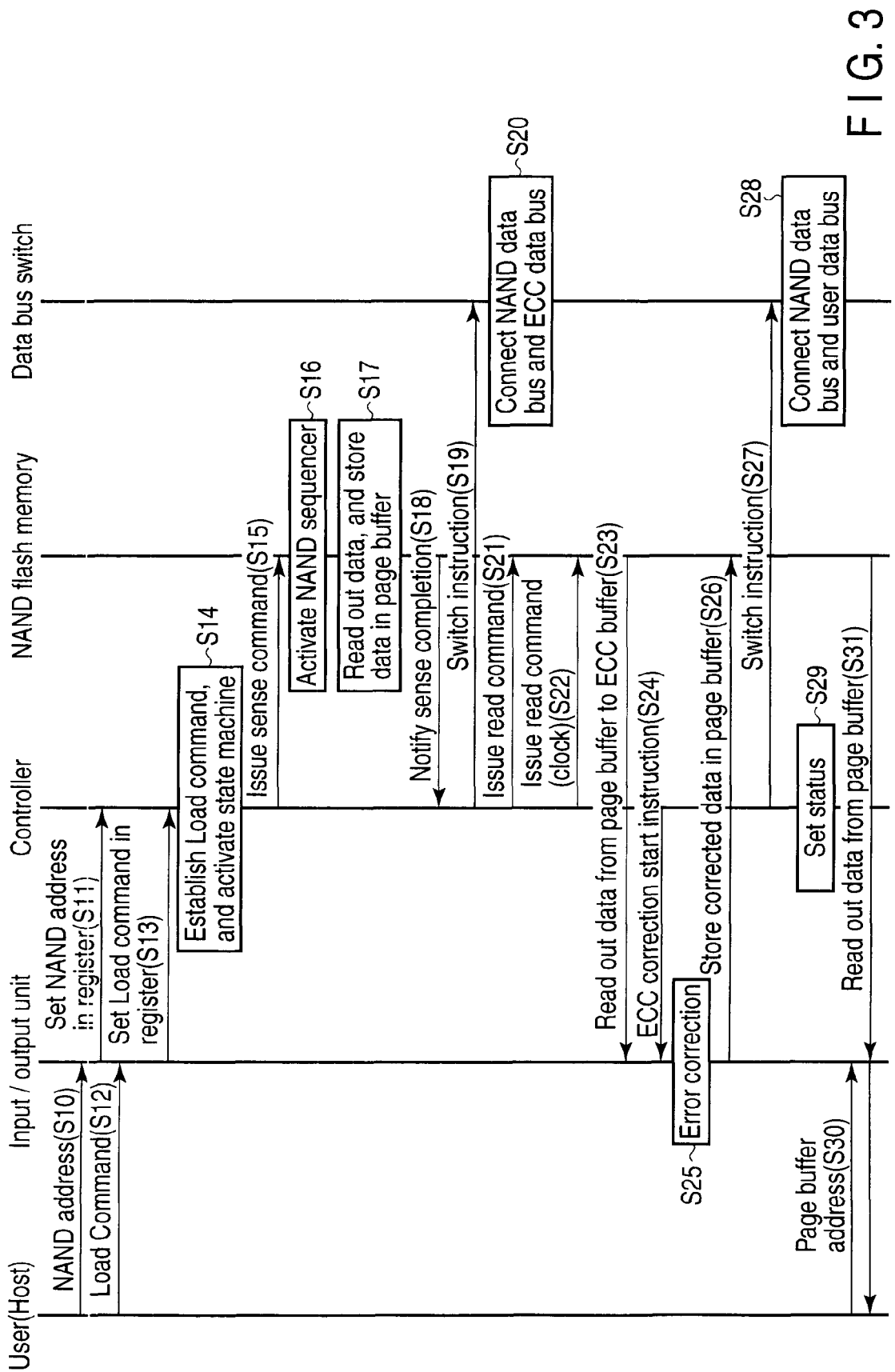
FIG. 3 is a flowchart of a data read method according to the embodiment.

A data read operation in the memory system 1 with the above configuration will be explained below with reference to FIG. 3. FIG. 3 is a flowchart showing the procedure of the operation of the memory system 1.

As shown in FIG. 3, the user interface 23 first receives an address input from the user via the host apparatus (step S10). This address is the page address of the memory cell array 10 in the NAND flash memory 2. This page address is transferred from the user interface 23 to the access controller 24. The access controller 24 activates the register 40 in the controller 4, and transfers the page address (step S11).

Subsequently, the user interface 23 receives a load command input from the host apparatus (step S12). The access controller 24 having received the load command sets it in the register 40 (step S13).

When the command is set in the register 40, the command user interface 41 detects the command, and generates an internal command signal. In this case, the load command is established (step S14). The state machine 42 is activated in response to the establishment of the load command.

The state machine 42 performs necessary initialization for each circuit block, and requests the NAND address/command generator 43 to issue a sense command to the NAND flash memory 2. The NAND address/command generator 43 issues a sense command to the sequencer 16 so as to sense data in the address set in the register 40 (step S15).

When receiving the sense command from the NAND address/command generator 43, the sequencer 16 is activated in the NAND flash memory 2 (step S16). The sequencer 16 initializes necessary circuits in the NAND flash memory 2, and performs the operation of sensing the designated address. That is, the sequencer 16 controls the voltage supply 15, row decoder 11, column decoder 14, sense amplifier 12, and page buffer 13 to store sense data in the page buffer 13 (step S17). More specifically, data is read out from a certain page in the memory cell array 10, the readout data is sensed and amplified, and the result is stored in the page buffer 13. After that, the sequencer 16 notifies the state machine 42 of the completion of the sense operation (step S18).

In addition, the state machine 42 instructs the data bus switch 5 to connect the NAND data bus 6 to the ECC data bus 8, via the buffer address/timing generator 44 and access controller 24 (step S19). In response to this instruction, the data bus switch 5 disconnects the NAND data bus 6 from the user data bus 7, and connects the NAND data bus 6 to the ECC data bus 8 (step S20).

Furthermore, the state machine 42 instructs the NAND address/command generator 43 to issue a read command. In response to this instruction, the NAND address/command generator 43 issues a read command supported by the NAND interface to the sequencer 16 (step S21). Upon receiving this read command, the sequencer 16 sets the page buffer 13 readable.

The state machine 42 issues a read command (clock) to the sequencer 16 (step S22). Consequently, data in the page buffer 13 is read out to the ECC buffer 31 via the NAND data bus 6 and ECC data bus 8 (step S23).

Subsequently, the state machine 42 issues an ECC correction start instruction to the ECC controller 34 via the buffer address/timing generator 44 (step S24). In response to this instruction, the ECC unit 30 performs error detection and error correction (step S25). That is, under the control of the ECC controller 34, the ECC analyzer 33 generates a syndrome for the data read out to the ECC buffer 31. The ECC decoder 32 determines the position of an error in the data based on this syndrome. The ECC decoder 32 then corrects the error, and stores the corrected data in the page buffer 13 (step S26).

After the ECC process, in response to an instruction of the state machine 42 (step S27), the data bus switch 5 disconnects the NAND data bus 6 from the ECC data bus 8, and connects the NAND data bus 6 to the user data bus 7 (step S28). The controller 4 sets, e.g., a status to be monitored by the user (step S29).

After that, when an address (in other words, a read request) is input from the host apparatus (step S30), the data in the page buffer 13 is output outside (step S31). This address is an address (page buffer address) for designating an arbitrary area in the page buffer 13. The page buffer address input to the user interface 23 is supplied to the decoder 25 via the access controller 24. The decoder 25 decodes this address, and instructs the column decoder 14 (or directly instructs the page buffer) to select data at the corresponding address in the page buffer 13. Consequently, the data at the address is read out to the pipeline buffer 21 via the NAND data bus 6 and user data bus 7, and output to the host apparatus via the burst buffer 22 and user interface 23.

<Operation of ECC Unit 30>

Figure 5:
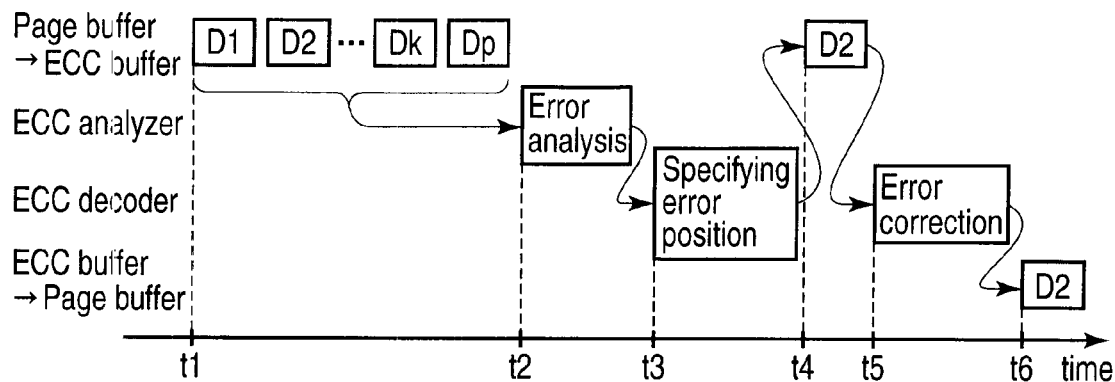
FIG. 5 is a timing chart of the data correction method according to the embodiment.

Details of steps S23 to S26 in the above-mentioned data read operation will be explained below with reference to FIGS. 4 and 5. FIG. 4 is a flowchart showing the details of steps S23 to S26. FIG. 5 is a timing chart showing data transferred from the page buffer 13 to the ECC buffer 31, the operations of the ECC analyzer 33 and ECC decoder 32, and data transferred from the ECC buffer 31 to the page buffer 13.

As shown in FIGS. 4 and 5, data in the page buffer 13 is transferred to the ECC buffer 31 for every bus width of the ECC data bus 8 (e.g., for every 4 bytes) (step S40). The data to be transferred contains ECC data in addition to main data. The size of the page buffer 13 is typically larger than the bus width of the ECC data bus 8. Accordingly, all data in the page buffer 13 are transferred to the ECC buffer 31 by repeating step S40 a plurality of number of times (NO in step S41, and step S40). This is the period of times t1 to t2 in FIG. 5. FIG. 5 shows an example in which all main data in the page buffer 13 are transferred to the ECC buffer 31 transferring the data k times (k is a natural number of 2 or more). Note that main data to be transferred for the i-th time (i is a variable of 2 to k) will be called data Di. That is, size of the data Di is 4 bytes. Also, Dp in FIG. 5 shows ECC data (parity). In the example shown in FIG. 5, parity Dp is transferred at once. However, it is also possible to divisionally transfer parity Dp a plurality of number of times. The ECC buffer 31 transfers data to the ECC analyzer 33 whenever receiving the data. Note that as described previously, the ECC buffer 31 has the capacity equivalent to, e.g., the bus width of the ECC data bus 8. In this case, therefore, whenever data is transferred from the page buffer 13, the ECC buffer 31 overwrites the new data on old data.

When all the data in the page buffer 13 are completely transferred (YES in step S41), the ECC analyzer 33 determines the presence/absence of an error in response to an ECC correction start instruction from the state machine 42 (step S42, times t2 to t3 in FIG. 5). That is, the ECC analyzer 33 generates a syndrome based on the data received in step S40.

If there is no error (NO in step S43), the process is terminated. If there is an error (YES in step S43), the ECC decoder 32 determines data having the error and the position of the error (step S44, times t3 to t4 in FIG. 5). Assuming that data D2 has an error, the ECC decoder 32 calculates the address (in the page buffer 13) of data D2, the bit position of the error, and the contents of the error.

Figure 6:
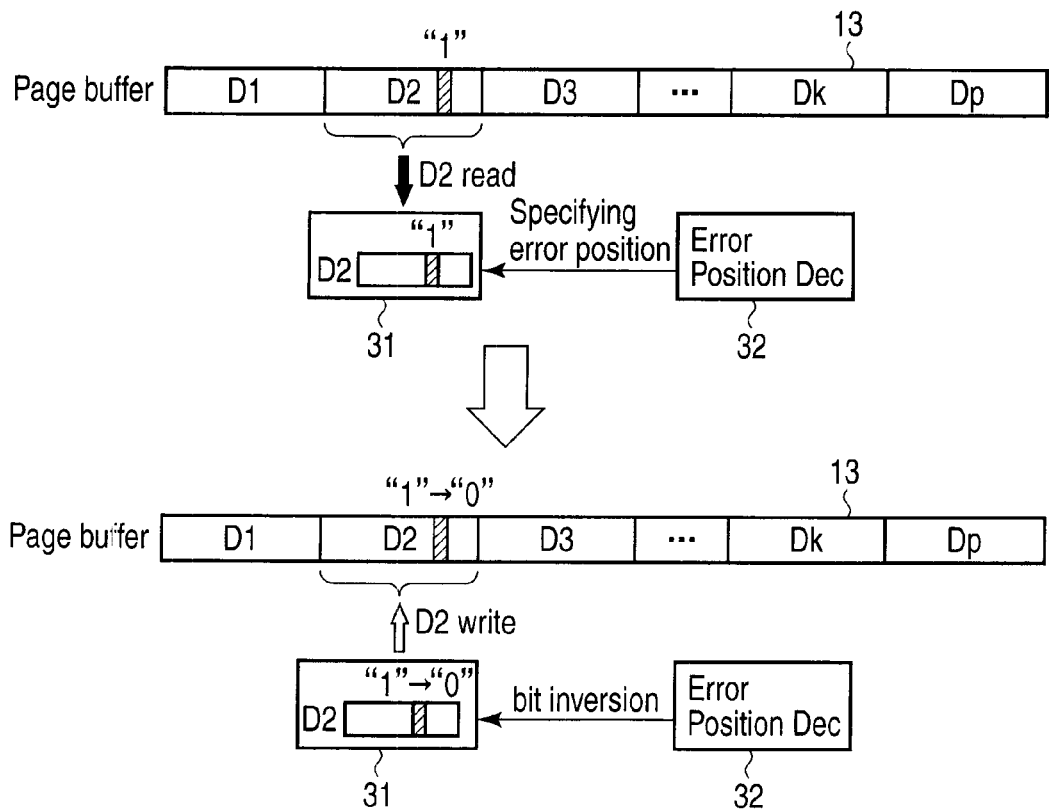
FIG. 6 is a block diagram of a NAND flash memory according to the embodiment.

Then, the ECC decoder 32 instructs the ECC buffer 31 to read out data D2 from the page buffer 13 (step S45, times t4 to t5 in FIG. 5). Other data D1, D3 to Dk, and Dp are not read out. The upper half of FIG. 6 shows this state. As shown in the upper half of FIG. 6, a certain bit of data D2 has an error, and "0" is inverted to "1". Accordingly, only data D2 is read out to the ECC buffer 31.

Subsequently, the ECC decoder 32 corrects the error (step S46, times t5 to t6 in FIG. 5). That is, as shown in the lower half of FIG. 6, the ECC decoder 32 inverts the error bit of data D2 in the ECC buffer 31 from "1" to "0". After that, the ECC buffer 31 overwrites error-corrected data D2 on data D2 of the page buffer 13 (step S47, time t6 in FIG. 5).

<Data Write Operation of Memory System 1>

Figure 7:
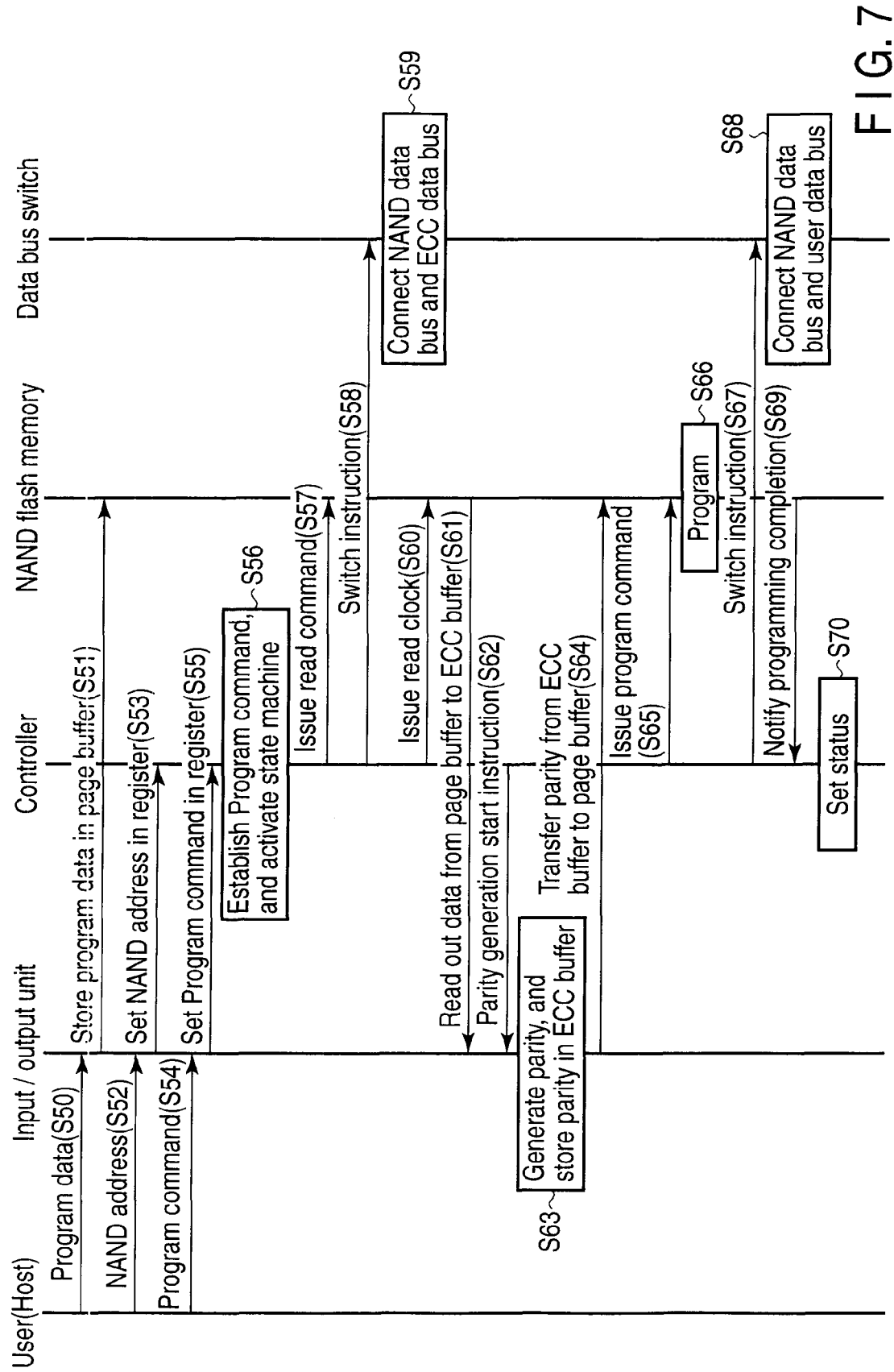
FIG. 7 is a flowchart of a data write method according to the embodiment.

A data write operation will be explained below with reference to FIG. 7. FIG. 7 is a flowchart showing the procedure of the operation of the memory system 1.

As shown in FIG. 7, the user interface 23 first receives, from the user via the host apparatus, data to be programmed (step S50). This data is stored in the page buffer 13 via the burst buffer 22, pipeline buffer 21, user data bus 7, and NAND data bus 6 (step S51).

After that, the user interface 23 receives an address input from the user via the host apparatus (step S52). This address is the page address of the memory cell array 10 in the NAND flash memory 2. This page address is transferred from the user interface 23 to the access controller 24. The access controller 24 activates the register 40 of the controller 4, and transfers the page address (step S53).

Subsequently, the user interface 23 receives a program command input from the host apparatus (step S54). The access controller 24 having received the program command sets it in the register 40 (step S55).

When the command is set in the register 40, the command user interface 41 detects the command, and generates an internal command signal. In this case, the program command is established (step S56). The state machine 42 is activated in response to the establishment of the program command.

The state machine 42 performs necessary initialization for each circuit block, and requests the NAND address/command generator 43 to issue a read command to the NAND flash memory 2. Therefore, the NAND address/command generator 43 issues a read command to the sequencer 16 (step S57). Upon receiving the read command, the sequencer 16 sets the page buffer 13 readable.

Subsequently, the state machine 42 instructs the data bus switch 5 to connect the NAND data bus 6 to the ECC data bus 8, via the buffer address/timing generator 44 and access controller 24 (step S58). In response to this instruction, the data bus switch 5 disconnects the NAND data bus 6 from the user data bus 7, and connects the NAND data bus 6 to the ECC data bus 8 (step S59).

The state machine 42 issues a read command (clock) to the page buffer 13 (step S60). Consequently, the data in the page buffer 13 is read out to the ECC buffer 31 via the NAND data bus 6 and ECC data bus 8 (step S61).

Subsequently, the state machine 42 issues a parity generation start instruction to the ECC controller 34 via the buffer address/timing generator 44 (step S62). In response to this instruction, the ECC unit 30 starts generating parity (step S63). That is, under the control of the ECC controller 34, the ECC analyzer 33 generates a syndrome for the data read out to the ECC buffer 31, and generates parity based on this syndrome. The ECC analyzer 33 stores the generated parity in the ECC buffer 31 via the ECC decoder 32, and transfers the parity to the page buffer 13 (step S64).

After that, the state machine 42 requests the NAND address/command generator 43 to issue a program command to the NAND flash memory 2. The NAND address/command generator 43 issues a program command to the sequencer 16 so that the data in the page buffer 13 is programmed at the address (page address) of the register 40 (step S65).

Upon receiving this program command, the sequencer 16 initializes necessary circuits in the NAND flash memory 2, and performs a programming operation (step S66). That is, the sequencer 16 programs the data in a predetermined page from the page buffer 13 by controlling the voltage supply 15, row decoder 11, column decoder 14, sense amplifier 12, and page buffer 13.

Furthermore, the state machine 42 instructs the data bus switch 5 to connect the NAND data bus 6 to the user data bus 7, via the buffer address/timing generator 44 and access controller 24 (step S67). In response to this instruction, the data bus switch 5 disconnects the NAND data bus 6 from the ECC data bus 8, and connects the NAND data bus 6 to the user data bus 7 (step S68).

When programming is complete in the NAND flash memory 2, the sequencer 16 notifies the state machine 42 of the completion (step S69). After that, the controller 4 sets, e.g., a status to be monitored by the user (step S70).

<Operation of ECC Unit 30>

Details of steps S61 to S64 in the above-mentioned data write operation will be explained below with reference to FIGS. 8 and 9. FIG. 8 is a flowchart showing the details of steps S61 to S64. FIG. 9 is a timing chart showing data transferred from the page buffer 13 to the ECC buffer 31, the operation of the ECC analyzer 33, data transferred from the ECC analyzer 33 to the ECC buffer 31, and data transferred from the ECC buffer 31 to the page buffer 13.

As shown in FIGS. 8 and 9, all data in the page buffer 13 are transferred to the ECC buffer 31 in the same manner as in data read (steps S40 and S41, times t1 to t2 in FIG. 9). Data to be transferred to the ECC buffer 31 in data write is naturally main data to be programmed. Parity is generated from this.

When all the data in the page buffer 13 are completely transferred (YES in step S41), in response to a parity generation start instruction from the state machine 42, the ECC analyzer 33 generates a syndrome based on the data received in step S40, and generates parity based on the syndrome (step S80, times t2 to t3 in FIG. 9).

The ECC analyzer 33 transfers parity Dp to the ECC buffer 31 (step S81, times t3 to t4 in FIG. 9), and transfers parity Dp to the page buffer 13 (step S82, time t4 in FIG. 9).

Figure 10:
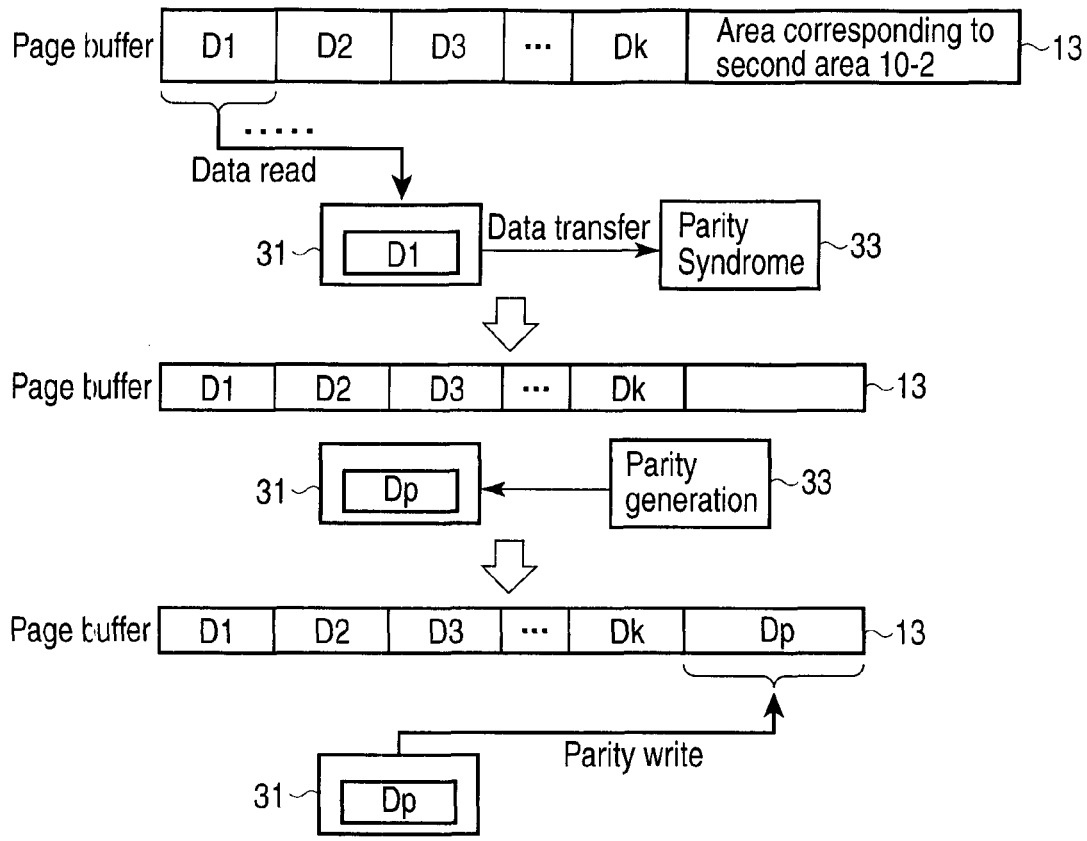
FIG. 10 is a block diagram showing the NAND flash memory according to the embodiment.

FIG. 10 is an exemplary view showing this state. That is, FIG. 10 is a block diagram showing the page buffer 13 and a part of the ECC unit 30, and sequentially depicts the way the data is transferred with the elapse of time. As shown in FIG. 10, data D1 to Dk are first sequentially transferred to the ECC buffer 31, and then transferred to the ECC analyzer 33. As in the data read operation, data is transferred by the bus width of the ECC data bus 8. Accordingly, all the data are divisionally transferred to the ECC buffer 31 k times.

Then, the ECC analyzer 33 generates parity. Parity Dp is transferred to (overwritten in) the ECC buffer 31.

After that, the ECC buffer 31 stores parity Dp in the page buffer 13. An area in which parity Dp is stored corresponds to the second area 10-2 of the memory cell array 10 explained above with reference to FIG. 2.

EFFECTS OF EMBODIMENT

As described above, the arrangement according to the embodiment can reduce the circuit area of a semiconductor device including a NAND flash memory. This effect will be explained below.

In the arrangement according to this embodiment, the input/output unit 3 includes the two data buses, i.e., the user data bus 7 and ECC data bus 8. The user data bus 7 is connected to the user interface 23 that communicates with an external host apparatus. The ECC data bus 8 is connected to the ECC unit 30. In addition, the input/output unit 3 includes the data bus switch 5, and switches the connections of the NAND data bus 6 to the user data bus 7 and ECC data bus 8.

More specifically, when writing data in the NAND flash memory 2, the data bus switch 5 connects the NAND data bus 6 to the user data bus 7, and the write data is stored in the page buffer 13. After that, the data bus switch 5 connects the NAND data bus 6 to the ECC data bus 8, the write data is read out to the ECC buffer 31 to generate parity, and the parity is written in the page buffer 13.

On the other hand, when reading out data from the NAND flash memory 2, the data bus switch 5 connects the NAND data bus 6 to the ECC data bus 8, the main data and parity is read out from the page buffer 13 to the ECC buffer 31 and subjected to error correction, and the corrected data is overwritten in the page buffer 13. After that, the data bus switch 5 connects the NAND data bus 6 to the user data bus 7, and the readout data is output outside.

In the configuration as described above, the page buffer 13 of the NAND flash memory 2 is used as a buffer memory of the memory system 1. This obviates the need for a buffer memory such as an SRAM in the conventional system. Therefore, the circuit area can largely be reduced.

The following difference is obtained especially when comparing the above arrangement with the conventional arrangement including an SRAM and NAND flash memory. That is, in the conventional arrangement, the ECC buffer is connected to the SRAM buffer by the data bus, so the page buffer, ECC buffer, and SRAM buffer are connected in series. In the arrangement according to this embodiment, however, there is no data bus for directly connecting the ECC buffer 31 to another buffer, and the data bus switch 5 connects the ECC buffer 31 in parallel to the pipeline buffer 21. In other words, the ECC data bus 8 is connected in parallel to the user data bus 7 for connecting to the outside.

This allows the user to directly read out data from and write data in the page buffer 13. Accordingly, the page buffer 13 can function as a buffer memory of the memory system 1.

Also, the input/output unit 3 includes the decoder 25 and can access the page buffer 13 using the decoder 25. That is, the input/output unit 3 can access the page buffer 13 by a system different from the internal operation controlled by the sequencer 16 in the NAND flash memory 2. Therefore, the user can randomly access (perform read and write to) the page buffer 13.

Note that to perform the ECC process in the arrangement according to this embodiment, data is stored in the page buffer 13 and then read out to the ECC buffer 31. Since no SRAM is used, however, no data transfer is necessary between the SRAM buffer and page buffer. This makes it possible to prevent the prolongation of the data transfer time including the ECC process.

The above embodiment has been explained by taking, as an example, the arrangement in which the NAND flash memory includes the two cache memory stages (the sense amplifier 12 (primary data cache) and the page buffer 13 (secondary data cache)). However, the NAND flash memory need only have one cache memory stage. In this case, the NAND data bus 6 is connected to the sense amplifier 12.

Also, even in the arrangement including the two cache memory stages, the NAND data bus 6 may be connected to the sense amplifier 12 instead of the page buffer 13. In this case, the sense amplifier 12 functions as a buffer memory.

Figure 11:
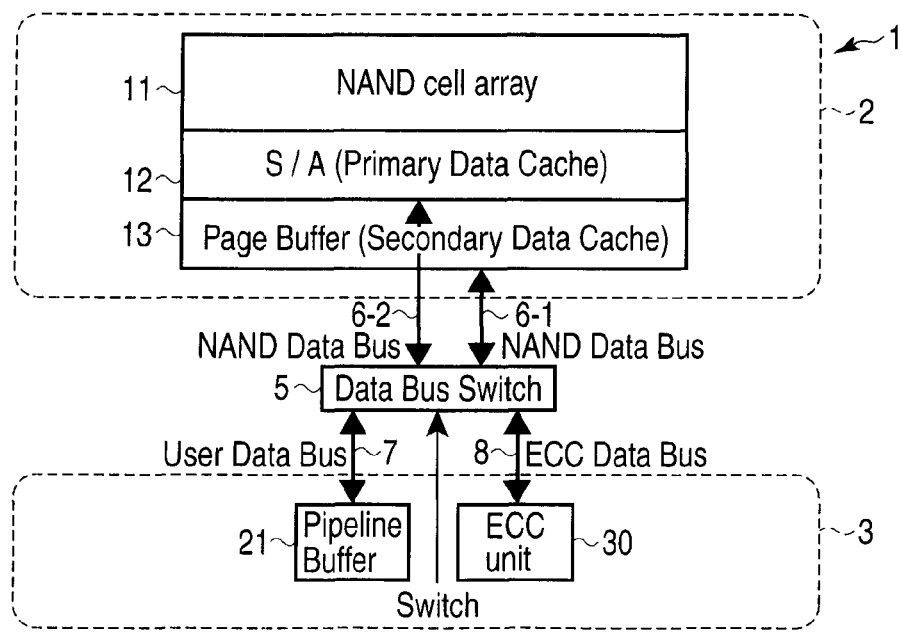
FIG. 11 is a block diagram of a memory system according to a modification of the embodiment.

Furthermore, it is also possible to form two NAND data buses 6, and connect one of them to the page buffer 13 and the other to the sense amplifier 12. FIG. 11 shows an example of this configuration. FIG. 11 is a block diagram of the memory system 1 according to a modification of the above-mentioned embodiment, and shows only a partial area of the memory system 1. As shown in FIG. 11, two NAND data buses 6-1 and 6-2 are formed. The NAND data bus 6-1 is connected to the page buffer 13, and the NAND data bus 6-2 is connected to the sense amplifier 12. The data bus switch 5 determines whether to connect the NAND data buses 6-1 and 6-2 to the user data bus 7 or ECC data bus 8. For example, it is possible to connect one of the NAND data buses 6-1 and 6-2 to the user data bus 7 and the other to the ECC data bus 8 at certain timing. This arrangement can further increase the operating speed of the memory system 1.

The above embodiment has been explained by taking, as an example, the arrangement in which the NAND flash memory 2, input/output unit 3, controller 4, and data bus switch 5 are integrated into one chip. A practical example of the memory system 1 like this is a "OneNAND (registered trademark)" type flash memory. However, the memory system is not limited to one chip, and it is also possible to implement the NAND flash memory 2, input/output unit 3, controller 4, and data bus switch 5 by different semiconductor chips. Furthermore, the above embodiment has been explained by taking the arrangement in which the NAND flash memory is used as a main memory as an example. However, the main memory is not limited to the NAND flash memory, and it is also possible to use another flash memory or another semiconductor memory such as a ferroelectric memory or resistive RAM (ReRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a NAND flash memory;
    an input/output unit which includes an ECC unit configured to perform an ECC process on data input to the NAND flash memory, and/or data output from the NAND flash memory, and an interface configured to exchange data with an external apparatus, and controls input/output of data between the NAND flash memory and the external apparatus;
    a switch connected to the NAND flash memory and the input/output unit; and
    a controller which controls the NAND flash memory and the input/output unit, and switches a connection between the NAND flash memory and the ECC unit, and a connection between the NAND flash memory and the interface via the switch.

2. The device according to claim 1, wherein
    the NAND flash memory includes a memory cell array including a plurality of memory cells, each of the memory cells being associated with one of columns, and
    the input/output unit further includes a decoder which decodes an externally input address and selects one of the columns of the memory cell array.

3. The device according to claim 2, wherein in a data read operation, data corresponding to the one of the column selected by the decoder is transferred from the NAND flash memory to the input/output unit via the switch.

4. The device according to claim 1, wherein
    the NAND flash memory includes a memory cell array including a plurality of memory cells and a buffer memory which holds data read out from the memory cell array, each of the memory cells being associated with one of columns, and
    the ECC unit reads out data from the buffer memory, performs error correction on the data, and overwrites the buffer memory with the error-corrected data, when connected to the NAND flash memory by the switch.

5. The device according to claim 4, wherein
a size of the buffer memory is larger than a width of a bus connecting the NAND flash memory and the ECC unit, and
data in the buffer memory is read out to the ECC unit by performing a transfer operation a plurality of number of times.

6. The device according to claim 1, wherein
the NAND flash memory includes a memory cell array including a plurality of memory cells and a buffer memory which holds data to be written in the memory cell array, each of the memory cells being associated with one of columns,
the buffer memory receives the data transferred from the interface, when connected to the interface by the switch, and
the ECC unit reads out data from the buffer memory, generates parity for the data, and stores the generated parity in a predetermined address of the buffer memory, when connected to the NAND flash memory by the switch.

7. The device according to claim 4, wherein
a size of the buffer memory is larger than a width of a bus connecting the NAND flash memory and the ECC unit, and
data in the buffer memory is read out to the ECC unit by performing a transfer operation a plurality of number of times.

8. The device according to claim 4, wherein
the memory cell array further includes a bit line connected to the memory cells, and
the buffer memory includes a first memory which is connected to the bit line and exchanges data with the bit line, and a second memory which exchanges data with the first memory, the ECC unit, and the interface.

9. The device according to claim 6, wherein
the memory cell array further includes a bit line connected to the memory cells, and
the buffer memory includes a first memory which is connected to the bit line and exchanges data with the bit line, and a second memory which exchanges data with the first memory, the ECC unit, and the interface.

10. The device according to claim 8, wherein the switch is configured to connect one of the first memory and the second memory to the interface, and the other to the ECC unit at the same time.

11. The device according to claim 9, wherein the switch is configured to connect one of the first memory and the second memory to the interface, and the other to the ECC unit at the same time.

12. A controlling method for a semiconductor device, comprising:
reading out data from a memory cell of a NAND flash memory to a page buffer;
transferring the data to an ECC circuit via a first bus connected to the page buffer and a second bus connected to the ECC circuit, while the first bus is connected to the second bus;
performing error detection on the data by the ECC circuit, and, if there is an error, transferring error-corrected data to the page buffer;
disconnecting the first bus from the second bus after the error detection, and connecting the first bus to a third bus connectable to an external apparatus; and
reading out the data from the page buffer via the first bus and the third bus.

13. The method according to claim 12, wherein the performing the error detection by the ECC circuit and transferring the error-corrected data to the page buffer includes:
detecting an error in i-th data based on first to N-th data and parity transferred to the ECC circuit;
transferring the i-th data from the page buffer to the ECC circuit;
correcting the error of the i-th data transferred to the ECC circuit; and
overwriting the i-th data in the page buffer with the error-corrected i-th data.

14. The method according to claim 12, wherein the reading out data from the page buffer includes:
decoding an address received from an external apparatus; and
reading out data held in a partial area of the page buffer via the first bus and the third bus, in accordance with the decoding result of the address.

15. The method according to claim 12, further comprising:
issuing a switch instruction after data is read out from the memory cell to the page buffer; and
disconnecting the first bus from the third bus and connecting the first bus to the second bus, in response to the switch instruction.

16. A controlling method for a semiconductor device, comprising:
transferring data input from an external apparatus to a page buffer of a NAND flash memory via a first bus connectable to the external apparatus and a second bus connected to the NAND flash memory, while the first bus is connected to the second bus;
disconnecting the first bus from the second bus, and connecting the second bus to a third bus connected to an ECC circuit;
transferring the data from the page buffer to the ECC circuit via the second bus and the third bus; and
generating parity for the transferred data by the ECC circuit;
transferring the generated parity to the page buffer via the second bus and the third bus; and
writing the data and the parity in a memory cell of the NAND flash memory.

17. The method according to claim 16, further comprising:
issuing a write instruction to write the data and the parity in the memory cell;
issuing a switch instruction after the write instruction; and
disconnecting the first bus from the third bus and connecting the first bus to the second bus in response to the switch instruction.

* * * * *